(12) United States Patent
Joichi et al.

(10) Patent No.: US 8,455,886 B2
(45) Date of Patent: *Jun. 4, 2013

(54) LIGHT EMITTING DEVICE USING GAN LED CHIP

(75) Inventors: Takahide Joichi, Amagasaki (JP); Hiroaki Okagawa, Amagasaki (JP); Shin Hiraoka, Amagasaki (JP); Toshihiko Shima, Amagasaki (JP); Hirokazu Taniguchi, Amagasaki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/418,827

(22) Filed: Mar. 13, 2012

(65) Prior Publication Data

US 2012/0175669 A1    Jul. 12, 2012

Related U.S. Application Data

(62) Division of application No. 12/311,548, filed as application No. PCT/JP2007/069612 on Oct. 5, 2007, now Pat. No. 8,158,990.

(30) Foreign Application Priority Data

| Oct. 5, 2006 | (JP) | 2006-274510 |
| Sep. 19, 2007 | (JP) | 2007-242170 |
| Sep. 19, 2007 | (JP) | 2007-242171 |
| Sep. 19, 2007 | (JP) | 2007-242172 |
| Sep. 25, 2007 | (JP) | 2007-246410 |

(51) Int. Cl.
*H01L 27/15* (2006.01)

(52) U.S. Cl.
USPC ............... 257/84; 257/80; 257/81; 257/83; 257/257; 257/290; 257/676; 257/E25.033

(58) Field of Classification Search
USPC ........ 257/80, 83, 84, 257, 290, 676, E25.032, 257/E33.002, E33.059
See application file for complete search history.

(56) References Cited

U.S. PATENT DOCUMENTS

| 5,923,053 A | 7/1999 | Jakowetz et al. |
| 6,144,043 A | 11/2000 | Ogihara et al. |

(Continued)

FOREIGN PATENT DOCUMENTS

| CN | 1421936 | 6/2003 |
| CN | 1482687 | 3/2004 |

(Continued)

OTHER PUBLICATIONS

International Search Report mailed Dec. 18, 2007 for International Application No. PCT/JP2007/069612.

(Continued)

*Primary Examiner* — N Drew Richards
*Assistant Examiner* — Joannie A Garcia
(74) *Attorney, Agent, or Firm* — Wenderoth, Lind & Ponack, L.L.P.

(57) ABSTRACT

A light emitting device is constituted by flip-chip mounting a GaN-based LED chip. The GaN-based LED chip includes a light-transmissive substrate and a GaN-based semiconductor layer formed on the light-transmissive substrate, wherein the GaN-based semiconductor layer has a laminate structure containing an n-type layer, a light emitting layer and a p-type layer in this order from the light-transmissive substrate side, wherein a positive electrode is formed on the p-type layer, the electrode containing a light-transmissive electrode of an oxide semiconductor and a positive contact electrode electrically connected to the light-transmissive electrode, and the area of the positive contact electrode is half or less of the area of the upper surface of the p-type layer.

11 Claims, 13 Drawing Sheets

U.S. PATENT DOCUMENTS

| | | |
|---|---|---|
| 7,429,750 B2 | 9/2008 | Suehiro et al. |
| 7,534,633 B2 | 5/2009 | Batres et al. |
| 2002/0000558 A1 | 1/2002 | Morimoto |
| 2004/0046166 A1 | 3/2004 | Cho et al. |
| 2004/0164314 A1 | 8/2004 | Nakahara |
| 2005/0211997 A1 | 9/2005 | Suehiro et al. |
| 2006/0132420 A1 | 6/2006 | Yoshida et al. |
| 2007/0077349 A1 | 4/2007 | Newman et al. |
| 2007/0278511 A1 | 12/2007 | Ohno et al. |
| 2011/0079885 A1 | 4/2011 | Camacho et al. |
| 2011/0241170 A1 | 10/2011 | Haeberlen et al. |
| 2011/0278707 A1 | 11/2011 | Chi et al. |

FOREIGN PATENT DOCUMENTS

| | | |
|---|---|---|
| CN | 1521868 | 8/2004 |
| CN | 1194424 | 3/2005 |
| JP | 07-086640 | 3/1995 |
| JP | 9-116196 | 5/1997 |
| JP | 2000-183400 | 6/2000 |
| JP | 2002-280611 | 9/2002 |
| JP | 2003-318441 | 11/2003 |
| JP | 2004-165654 | 6/2004 |
| JP | 2004-179347 | 6/2004 |
| JP | 2005-19919 | 1/2005 |
| JP | 2005-117035 | 4/2005 |
| JP | 2005-209733 | 8/2005 |
| JP | 2006-66868 | 3/2006 |
| JP | 2006-253240 | 9/2006 |
| JP | 2006-261609 | 9/2006 |
| WO | 03/036718 | 5/2003 |
| WO | 2005/091383 | 9/2005 |

OTHER PUBLICATIONS

Chinese Office Action issued Aug. 3, 2010 in corresponding Chinese Application No. 200780044384.5 w/English translation.

Japanese Office Action issued Sep. 25, 2012 in corresponding Japanese Application No. 2007-242171.

Japanese Office Action issued Sep. 25, 2012 in corresponding Japanese Application No. 2007-242172.

Japanese Office Action issued Sep. 25, 2012 in corresponding Japanese Application No. 2007-246410.

FIG. 9
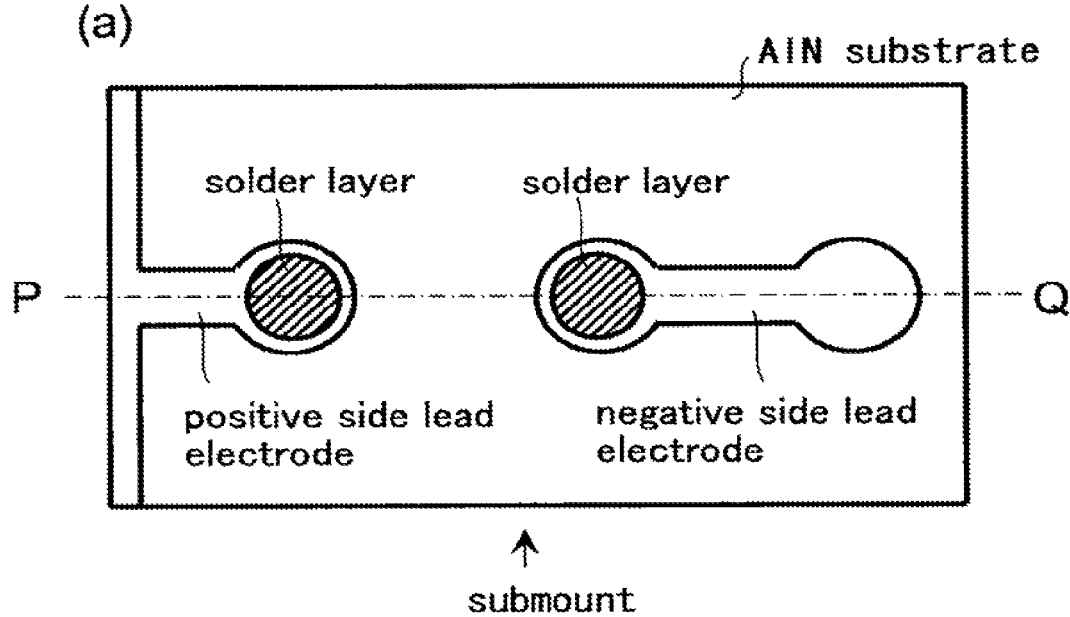
(a)
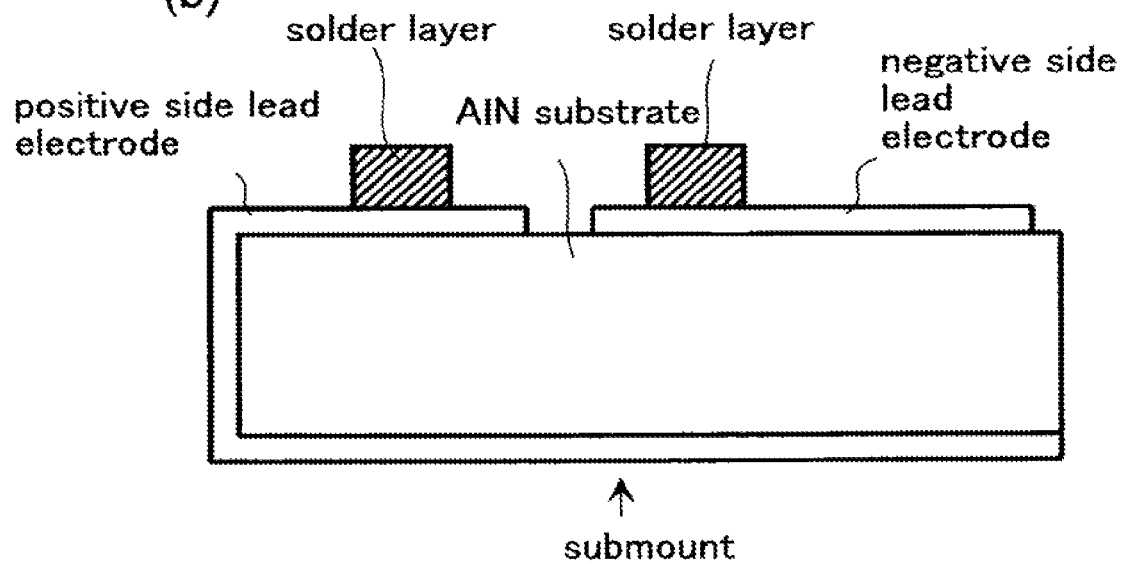
(b)

LIGHT EMITTING DEVICE USING GAN LED CHIP

CROSS-REFERENCE TO RELATED APPLICATION

This application is a divisional of U.S. application Ser. No. 12/311,548, now U.S. Pat. No. 8,158,990, filed Aug. 18, 2009, which is a national stage application of PCT/JP2007/069612, filed Oct. 5, 2007, the entireties of which are incorporated herein by reference.

BACKGROUND OF THE INVENTION

I. Technical Field

The present invention mainly relates to a light emitting device comprising a flip-chip mounted GaN-based LED chip with a light emitting element structure consisting of a GaN-based semiconductor formed on a light-transmissive substrate.

II. Description of the Related Art

The GaN-based semiconductor is a compound semiconductor represented by a chemical formula:

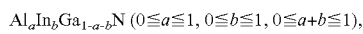
$Al_aIn_bGa_{1-a-b}N$ ($0 \leq a \leq 1$, $0 \leq b \leq 1$, $0 \leq a+b \leq 1$), which is also called a III group nitride semiconductor, a nitride-based semiconductor and the like. A compound semiconductor of the above-mentioned chemical formula wherein a part of the III group element is substituted by B (boron), Tl (thallium) and the like and one wherein a part of N (nitrogen) is substituted by P (phosphorus), As (arsenic), Sb (antimony), Bi (bismuth) and the like are also encompassed in the GaN-based semiconductor. A GaN-based LED wherein a light emitting element structure such as a pn junction structure, a double heterostructure and a quantum well structure is constituted of a GaN-based semiconductor can emit green to near ultraviolet light, and has been put to a practical use for signal, display apparatus and the like.

A GaN-based LED chip comprising a GaN-based semiconductor layer with a light emitting element structure formed on a light-transmissive substrate can be fixed on a base such as a substrate of an SMD (Surface Mount Device)-type LED package and a lead frame, directly or via a submount, with the GaN-based semiconductor layer side facing the base. In other words, the LED chip can be fixed on a base with the light-transmissive substrate side facing upward. This type of chip bonding form is called flip-chip mounting. The flip-chip mounting is also sometimes called facedown mounting, upside-down mounting, junction-down mounting and the like. Conventional GaN-based LED chips for flip-chip mounting have, on a surface of a GaN-based semiconductor layer and the like, a metal reflection film also acting as an electrode, so as to reflect light generated inside the GaN-based semiconductor layer to the light-transmissive substrate side. To improve the emission power when mounted, it is considered desirable to form this reflection film using a metal having a high light-reflection coefficient such as Ag (silver), Al (aluminum) and Rh (rhodium) as a material (JP-A-2000-183400, JP-A-2004-179347). See also, JP-A-2002-280611 and JP-A-2003-318441.

SUMMARY OF THE INVENTION

However, the present inventors have investigated and found that when a GaN-based LED chip to be flip-chip mounted has a reflection structure mainly constituted of a metal reflection film, improving an emission power of the light emitting device is limited. Particularly, when a white light emitting device that emits light from a phosphor is configured using, as an excitation light source, a GaN-based LED chip provided with a reflection structure mainly constituted with a metal reflection film directly formed on a surface of a GaN-based semiconductor layer, it is difficult to produce one having a sufficient output power for illumination purposes.

The present invention has been made in view of the above-mentioned problems of the Prior Art, and mainly aims to improve an output power of a light emitting device comprising a flip-chip mounted GaN-based LED chip, and provide a light emitting device superior in light emission power which can be preferably used as an excitation light source of a white light emitting device for illumination.

The present inventors have completed the present invention by escaping from an idea of constituting a reflection structure of a GaN-based LED chip to be flip-chip mounted mainly with a metal reflection film.

Therefore, in one embodiment of the present invention, a light emitting device wherein a GaN-based LED chip of the following (a) is flip-chip mounted is provided to solve the above-mentioned problems:

(a) a GaN-based LED chip comprising a light-transmissive substrate and a GaN-based semiconductor layer formed on the light-transmissive substrate, the GaN-based semiconductor layer having a laminate structure comprising an n-type layer, a light emitting layer and a p-type layer in this order from the light-transmissive substrate side,
wherein a positive electrode is formed on the p-type layer, said electrode comprising
a light-transmissive electrode made of an oxide semiconductor, and
a positive contact electrode electrically connected to the light-transmissive electrode, and
the area of the positive contact electrode is less than ½ of the area of the upper surface of the p-type layer.

In a preferred embodiment of the light emitting device, the area of the positive contact electrode is less than ⅓ of the area of the upper surface of the p-type layer.

In a more preferred embodiment of the light emitting device, the area of the positive contact electrode is less than ¼ of the area of the upper surface of the p-type layer.

In this light emitting device, the flip-chip mounted GaN-based LED chip may be encapsulated with a resin.

In this light emitting device, the surface of the light-transmissive electrode may be planarized by polishing.

The following explains the reason why the above-mentioned light emitting device provided by the present invention is superior in light emission power.

The main characteristic of the light emitting device is that a GaN-based LED chip intentionally utilizing a reflection caused by a difference in refractive indices between light-transmissive substances is flip-chip mounted. There has not conventionally existed an idea of taking note of such reflection due to difference in refractive indices for LED chips to be flip-chip mounted. Light-transmissive substances relating to the reflection include a GaN-based semiconductor layer, a light-transmissive electrode made of an oxide semiconductor, and a light-transmissive encapsulant or gas (in case of airtight seal) which is a medium surrounding the LED chip.

In one embodiment, a light-transmissive insulating protective film is also involved in the reflection. In a GaN-based LED chip comprising a GaN-based semiconductor layer formed by laminating an n-type layer, a light emitting layer and a p-type layer on a light-transmissive substrate in this order, at least a positive contact electrode (bonding pad)

needs to be formed as a metal film on the GaN-based semiconductor layer side face. In the GaN-based LED chip of the above-mentioned (a) constituting the light emitting device, the positive contact electrode is not made too large in area. It is known that light generated in a light emitting layer of an LED chip is repeatedly reflected inside the chip before going out of it. Thus, a slight difference in the loss in one reflection greatly influences the power of light extracted from the chip. Because of the smaller loss accompanied by a reflection due to a difference in refractive indices between light-transmissive substances than a reflection loss at a metal surface, the light emitting device is superior in light emission power.

Since the light emitting device of the present invention is superior in light emission power, it can be preferably used for applications requiring high power including illumination purposes.

BRIEF DESCRIPTION OF THE DRAWINGS

FIG. 2 shows a structure of a GaN-based LED chip contained in the light emitting device of FIG. 1, wherein FIG. 2(a) is a top view and FIG. 2(b) is a sectional view along the line X1-Y1 in FIG. 2(a).

FIG. 4 shows a structure of a GaN-based LED chip contained in the light emitting device of FIG. 3, wherein FIG. 4(a) is a top view and FIG. 4(b) is a sectional view along the line X2-Y2 in FIG. 4(a).

FIG. 6 is a sectional view of a GaN-based LED chip usable in a light emitting device according to an embodiment of the present invention, wherein FIG. 6(a) shows an example of a GaN-based LED chip having a horizontal-type element structure and FIG. 6(b) shows an example of a GaN-based LED chip having a vertical-type element structure.

FIG. 9 shows a structure of the submount used in Experimental Example 1, wherein FIG. 9(a) is a top view and FIG. 9(b) is a sectional view along the line P-Q in FIG. 9(a).

DETAILED DESCRIPTION OF THE INVENTION

Embodiment 1

Figure 1:
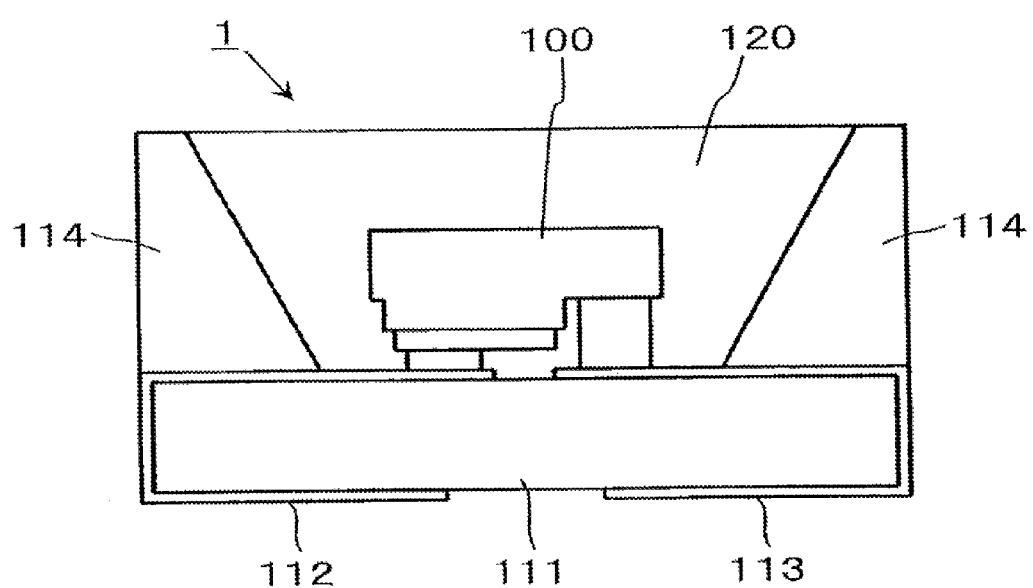
FIG. 1 is a sectional view showing a structure of a light emitting device according to an embodiment of the present invention.

FIG. 1 is a sectional view of a light emitting device according to an embodiment of the present invention. The light emitting device 1 shown in this Figure exhibits a form of SMD (Surface Mount Device)-type LED package, and a GaN-based LED chip 100 of the above-mentioned (a) is flip-chip mounted on a substrate 111 made of ceramic, resin and the like. The GaN-based LED chip 100 is fixed by bonding each of the positive electrode and negative electrode formed on the same side of the LED chip 100 to electrodes 112 and 113 formed on the substrate 111. As a bonding agent (not shown), one having electrical conductivity, for example, a solder such as Au—Sn solder, a conductive paste such as silver paste and the like, is used. A reflector 114 is, in this embodiment, an independent part from the substrate 111, though it can also be integrally formed with the substrate. A light-transmissive encapsulant 120 such as an epoxy resin and a silicone resin fills a cavity (cup-shaped part) constituted with the substrate 111 and reflector 114. To provide a white light emitting device, a phosphor is dispersed in the light-transmissive encapsulant 120. It is also possible to seal the cavity airtightly with a light-transmissive cap made of glass and the like instead of filling it with resin and the like.

Figure 2:
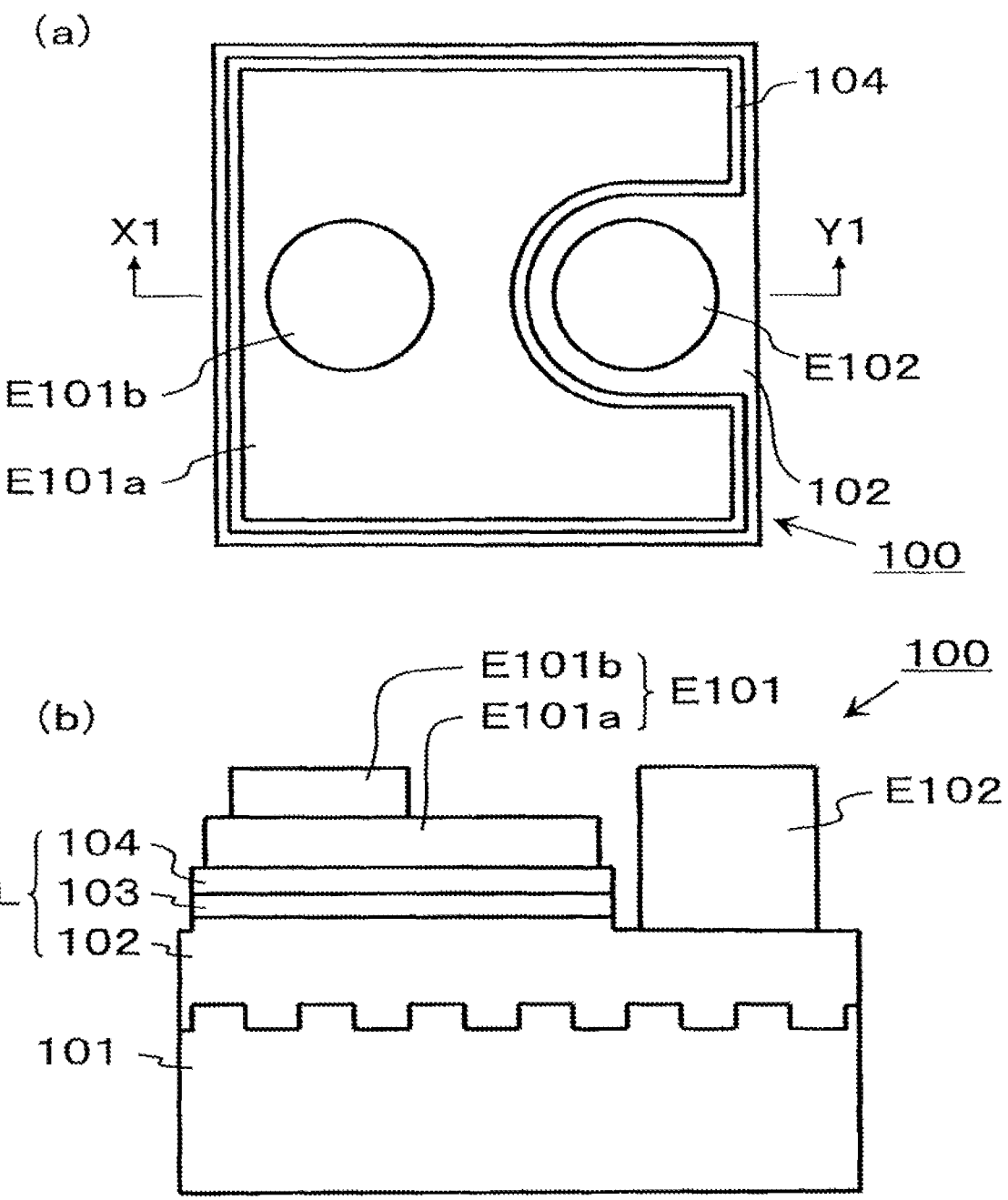

The structure of GaN-based LED chip 100 contained in the light emitting device 1 is shown in FIG. 2. FIG. 2(a) is a top view and FIG. 2(b) is a sectional view along the line X1-Y1 in FIG. 2(a). The GaN-based LED chip 100 has a structure wherein a GaN-based semiconductor layer L is laminated on a light-transmissive substrate 101. The GaN-based semiconductor layer L has a laminate structure sequentially comprising an n-type layer 102, a light emitting layer 103 and a p-type layer 104 from the light-transmissive substrate 101 side.

A single crystal substrate made of sapphire, spinel, silicon carbide, zinc oxide, magnesium oxide, GaN, AlGaN, AlN, NGO ($NdGaO_3$), LGO ($LiGaO_2$), LAO ($LaAlO_3$) and the like can be preferably used as the light-transmissive substrate 101. In this embodiment, the surface of the light-transmissive substrate 101 is processed to form a concave-convex surface so that a bended interface is formed between the light-transmissive substrate 101 and the GaN-based semiconductor layer L. When a bended interface is present between the light-transmissive substrate 101 and the GaN-based semiconductor layer L, confinement within the GaN-based semiconductor layer L of the light generated in the light emitting layer 103 becomes weaker due to light-scattering action of the interface, even when the refractive index of the light-transmissive substrate 101 is lower than that of the GaN-based semiconductor layer L. When the confinement becomes weaker, the frequency of internal reflection experienced by the light generated in the light emitting layer 103 becomes lower before it goes out of the GaN-based semiconductor layer L and consequently the light passes the light emitting layer 103, which strongly absorbs the light, less frequently, resulting in an increase in the power of the light extracted from the LED chip.

While the concave-convex pattern on the surface of the light-transmissive substrate 101 can be an optional pattern, it is preferably a pattern having periodicity, so that a GaN-based semiconductor crystal uniformly grows on the concave-convex surface. Examples of the periodic pattern include a pattern wherein a stripe-shaped concave part (groove) and a stripe-shaped convex part (ridge) are alternately arranged, and a pattern wherein a dot-like concave part (recess) having a bottom surface with a circular shape or regular polygon shape or a dot-like convex part (protrusion) having an upper surface with a circular shape or regular polygon shape is regularly configured. Concave and convex can be formed by forming an etching mask patterned to have an opening on a surface of a light-transmissive substrate 101, and then forming a concave part at the position of the opening by etching over the mask. The depth of the concave part when seen from the top of the convex part may be, for example, 0.2 µm-5 µm. This depth is preferably 0.5 µm-3 µm, more preferably 1 µm-2 µm. The width of the stripe when the concave part and convex part are stripe-like or the width of the dot (width where it is maximum) when they are dot-like may be, for example, 0.2 µm-10 µm. The width is preferably 0.5 µm-5 µm, more preferably 1 µm-3 µm. As for the pattern, cross sectional shape, size and the like of the concaves and convexes, patent document 3 and patent document 4 can be referred to.

The GaN-based semiconductor layer L can be formed on the light-transmissive substrate 101 by a vapor phase epitaxy method such as MOVPE (metalorganic vapor phase epitaxy), molecular beam epitaxy (MBE), hydride vapor phase epitaxy (HVPE) and the like. When the light-transmissive substrate 101 is made from a material that does not lattice-match with a GaN-based semiconductor, a buffer layer (not shown) is interposed between the light-transmissive substrate 101 and the GaN-based semiconductor layer L. A preferable buffer layer is a low-temperature buffer layer made from GaN, AlGaN and the like.

The n-type layer 102 is doped with Si (silicon), Ge (germanium), Se (selenium), Te (tellurium), C (carbon) and the like, as n-type impurity. In the n-type layer 102, a part being in contact with a negative electrode E102 is preferably doped with an n-type impurity at a particularly high concentration to have a high carrier concentration. In addition, it is preferable for a part of the n-type layer being in contact with the light-transmissive substrate 101 directly or via a buffer layer to have a lowered n-type impurity concentration or to be undoped for improving the crystallinity of the GaN-based semiconductor layer grown thereon. When the surface of light-transmissive substrate 101 is a concave-convex surface, as for the method of growing a GaN-based semiconductor crystal to fill the concave part of the concave-convex surface, patent document 3 and the like can be referred to.

The light emitting layer 103 can be optionally doped with an impurity. The p-type layer 104 is doped with Mg (magnesium), Zn (zinc) and the like as p-type impurity. An annealing treatment or electron beam irradiation treatment to activate the p-type dopant impurity can be performed if necessary after formation of the p-type layer 104. In the p-type layer 104, a part being in contact with a light-transmissive electrode E101a is preferably doped with a p-type impurity at a high concentration of not less than $5 \times 10^{19}$ cm$^{-3}$.

Each layer constituting the GaN-based semiconductor layer L can be formed with a GaN-based semiconductor having any crystal composition such as GaN, AlGaN, InGaN and AlInGaN, and each layer can have a multi-layer structure wherein layers having different crystal compositions or impurity concentrations are laminated. To improve light emitting efficiency, it is preferable to form a double heterostructure wherein the light emitting layer 103 is sandwiched between clad layers having higher band gaps than that of the light emitting layer 103, and it is preferable that the light emitting layer 103 has a quantum well structure (single quantum well structure or multiple quantum well structure). The GaN-based semiconductor layer L may optionally have additional layers besides the n-type layer 102, light emitting layer 103 and p-type layer 104.

After forming the p-type layer 104, a negative electrode E102 acting as both ohmic electrode and contact electrode (bonding pad) is formed on the surface of the n-type layer 102 exposed by partly removing the p-type layer 104 and the light emitting layer 103 by etching. In a negative electrode E102, at least a part being in contact with the n-type layer 104 is formed with a material that forms an ohmic contact with an n-type GaN-based semiconductor. Such material is known and, for example, a simple substance of Al (aluminum), Ti (titanium), W (tungsten), Ni (nickel), Cr (chrome) or V (vanadium) or an alloy comprising one or more kinds of metals selected therefrom can be mentioned. It is known that conductive oxides such as ITO (indium tin oxide), indium oxide, tin oxide, IZO (indium zinc oxide), AZO (aluminum zinc oxide) and zinc oxide also form a good ohmic contact with an n-type GaN-based semiconductor. The surface layer of negative electrode E102 is made from a metallic material. When the negative electrode E102 and the electrode 113 are bonded together with a solder, the surface layer of negative electrode E102 is preferably made from Au (gold), Sn (tin) or other metallic material having a good solder wettability, according to the kind of the solder to be used.

In this embodiment, at the time of etching to expose the negative electrode forming surface, the p-type layer 104 and light emitting layer 103 are also removed from a region between adjacent elements on the wafer, i.e., a region where a dicing line or scribing line passes when cutting the wafer into chips in a later step, to expose the n-type layer 102 in this region. In this way, vibration and impact transmitted to the light emitting part during wafer cutting can be minimized.

A positive electrode E101 is formed on the p-type layer 104. The positive electrode E101 consists of a light-transmissive electrode E101a composed of an oxide semiconductor, and a positive contact electrode E101b formed thereon and electrically connected to the light-transmissive electrode E101a. In this embodiment, the entire positive contact electrode E101b is formed on the light-transmissive electrode E101a. However, it is not essential and only a part of the positive contact electrode may overlap the light-transmissive electrode.

Examples of oxide semiconductors usable for the light-transmissive electrode E101a include ITO (indium tin oxide), indium oxide, tin oxide, IZO (indium zinc oxide), AZO (aluminum zinc oxide), zinc oxide, and FTO (fluorine-doped tin oxide). The light-transmissive electrode E101a may have a multi-layer structure wherein different oxide semiconductor films are laminated. A method of forming the light-transmissive electrode E101a is not limited, and conventionally known methods such as sputtering, reactive sputtering, vacuum evaporation, ion beam assistted deposition, ion plating, laser ablation, CVD, spraying method, spin coating method, and dipping method can be appropriately used according to the kind of the oxide semiconductor. The light-transmissive electrode E101a made from an oxide semiconductor can be patterned by a lift-off method. As a different way, a patterning method comprising forming an oxide semiconductor film over the entire surface of p-type layer 104 before being ethed for the negative electrode formation, and then removing unnecessary parts by etching (wet or dry) may be used.

The surface planarity of the light-transmissive electrode E101a is desirably as high as possible. For example, an ITO thin film tends to be polycrystalline, and the surface of an ITO thin film formed by a usual method is a surface having fine protrusions and depressions with a roughness of about 30 nm-50 nm. When the surface of the light-transmissive electrode E101a has a roughness of this level, light generated in the light emitting layer 103 easily escapes from the chip through the surface of light-transmissive electrode E101a and the amount of light being reflected on the interface between the light-transmissive electrode E101a and light-transmissive encapsulant 120 (gas in the case of airtight seal) toward the light-transmissive substrate 101 side is decreased, which in turn reduces the output power of the light emitting device 1. Preferably, therefore, the light-transmissive electrode E101a is formed from an amorphous oxide semiconductor which gives a plane surface in an as-grown state. An oxide semiconductor can be made amorphous by lowering the film formation temparature, and in the case of ITO, the temperature is lowered to room temperature or below. IZO is known as an oxide semiconductor whose amorphous state is stable, and permitting amorphous film formation in a wide temperature range from room temperature to 350° C. Using IZO, a light-transmissive electrode can be easily formed with an amorphous film having high surface planarity. In a different way of improving the surface planarity of light-transmissive electrode E101a, the surface of the oxide semiconductor film may be polished after the film formation. This method is preferable when using an oxide semiconductor easily becoming polycrystalline such as ITO. When using this method, an oxide semiconductor film is formed on the entire upper surface of p-type layer 104, and after the surface is polished, the film is patterned into a predetermined electrode shape by etching. The surface planarity of the light-transmissive electrode E101a is preferably as high as the roughness is less than 20 nm, more preferably less than 10 nm, as measured by a stylus-type surface profiler, in all roughness indices of arithmetic mean roughness (Ra), maximum height (Rmax), ten points average height (Rz) and the like. It is obvious that by improving the planarity of the surface of light-transmissive electrode E101a the backside surface of the positive contact electrode E101b formed on the light-transmissive electrode E101a (the surface being in contact with the surface of light-transmissive electrode E101a) becomes smooth, causing an effect of increasing light reflectivity at the backside of the positive contact electrode. This effect also contributes to improve an output power of the light emitting device 1.

The light-transmissive electrode E101a is formed on almost entire surface of the p-type layer 104, whereas the positive contact electrode E101b is formed so as not to occupy too large area on the p-type layer 104. The area of positive contact electrode E101b is preferably less than ½, more preferably less than ⅓, particularly preferably less than ¼, of the area of the upper surface of p-type layer 104. In the most preferable embodiment, the area ratio ([the area of positive contact electrode]/[the area of upper surface of p-type layer]) is less than 1/10. When the area ratio is too small, the heat generated in the LED chip 100 does not escape to the substrate 111 side through positive contact electrode E101b. Therefore, the area of positive contact electrode E101b is desirably not lower than 3% of the area of the upper surface of the p-type layer 104.

Here, when a plurality of positive contact electrodes are formed, the area of positive contact electrode is the total area calculated by summing up the areas of plural electrodes. In this embodiment, the upper surface of the positive contact electrode E101b has a circular shape. However, the shape is not limited, and a regular polygon such as a square, a regular pentagon and a regular hexagon, a rectangle and the like may be employed. When positive contact electrode E101b is too small, mounting workability becomes worse and the bonding agent easily sticks out. Thus, a reasonable size is necessary. Nonlimitatively, when employing a circular shape, the diameter may be 60 mm-90 mm, and when employing a quadrate shape, the side length may be 60 mm-90 mm.

The material of positive contact electrode E101b is not limited, and metallic materials generally used for electrodes for an oxide semiconductor can be employed. Specifically, a simple substance of Zn (zinc), Ni (nickel), Pt (platinum), Pd (palladium), Rh (rhodium), Ru (ruthenium), Ir (iridium), Ti (titanium), Zr (zirconium), Mo (molybdenum), V, Nb (niobium), Ta (tantalum), Co (cobalt), W (tungsten), Cu (copper), Ag (silver), Al (aluminum) and the like or an alloy comprising one or more kinds of metals selected therefrom can be mentioned. The positive contact electrode E101b may have a laminate structure. The positive contact electrode E101b is preferably a single layer film or multi-layer film having, at least on the side being in contact with the light-transmissive electrode E101a, a layer made from a simple substance of Al, Ag, Rh or Pt or an alloy mainly made from these, so as to have a good reflectivity. Particularly preferred is a structure having an Al layer or Al alloy layer at least on the side being in contact with the light-transmissive electrode E101a. Preferable Al alloy mainly comprises Al and additionally comprises Ti, Nd (neodymium), Cu and the like.

Embodiment 2

Figure 3:
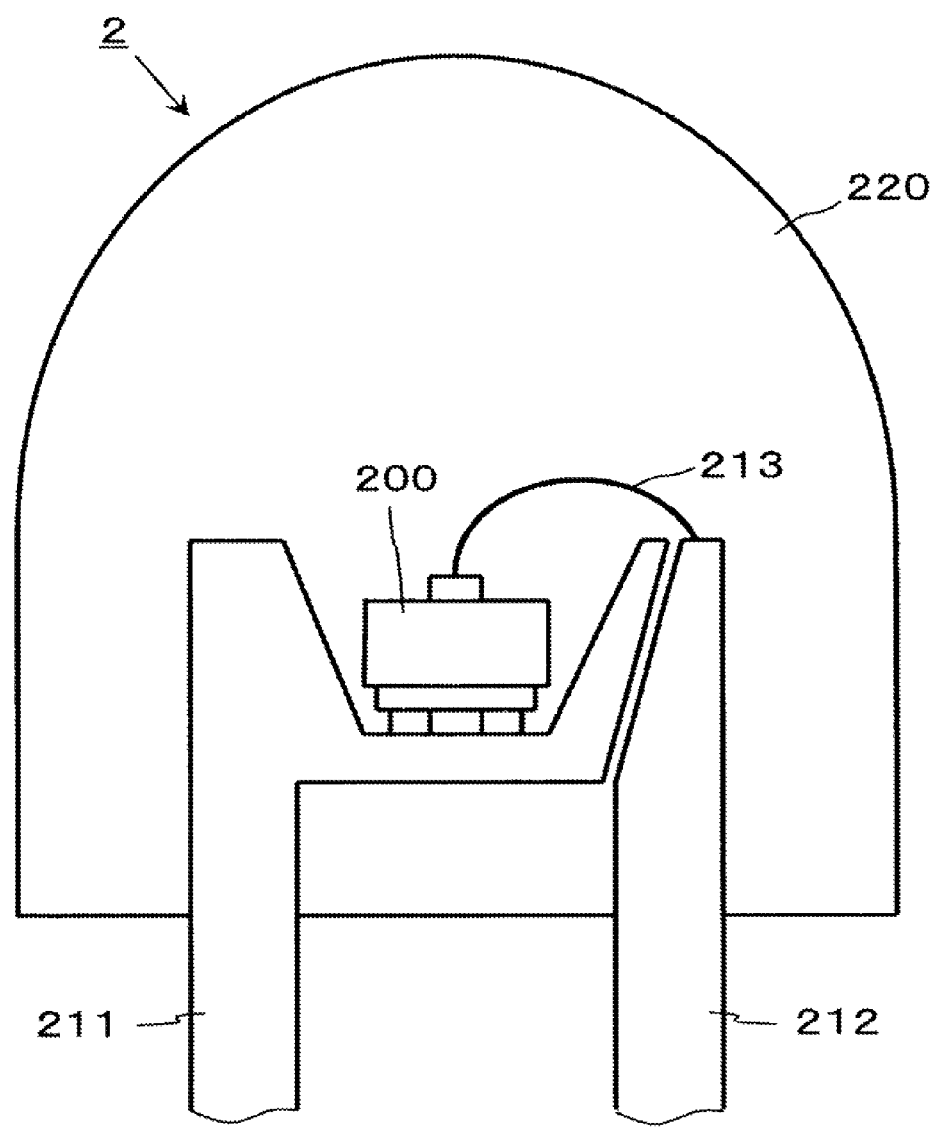
FIG. 3 is a sectional view showing a structure of a light emitting device according to an embodiment of the present invention.

FIG. 3 is a sectional view of a light emitting device according to another embodiment of the present invention. The light emitting device 2 shown in this Figure is a bullet type LED package, wherein a GaN-based LED chip 200 is flip-chip mounted in a cup-shaped part formed in a lead frame 211 and molded with a light-transmissive encapsulant 220 having a bullet shape. The light-transmissive encapsulant 220 is, for example, an epoxy resin. The GaN-based LED chip 200 is fixed by bonding a positive electrode formed on one side of the LED chip 200 to the lead frame 211. In this embodiment, the GaN-based LED chip 200 has a vertical-type element structure, and a negative electrode is formed on a chip surface opposite the positive electrode. This negative electrode is connected to the lead frame 212 by a bonding wire 213. When a white light emitting device is produced, a phosphor is dispersed in the light-transmissive encapsulant 220. It will be understood from the inclusion of this example in the embodiment of the present invention that the "flip-chip mounting" is not limited to wireless mounting in the present invention.

Figure 4:
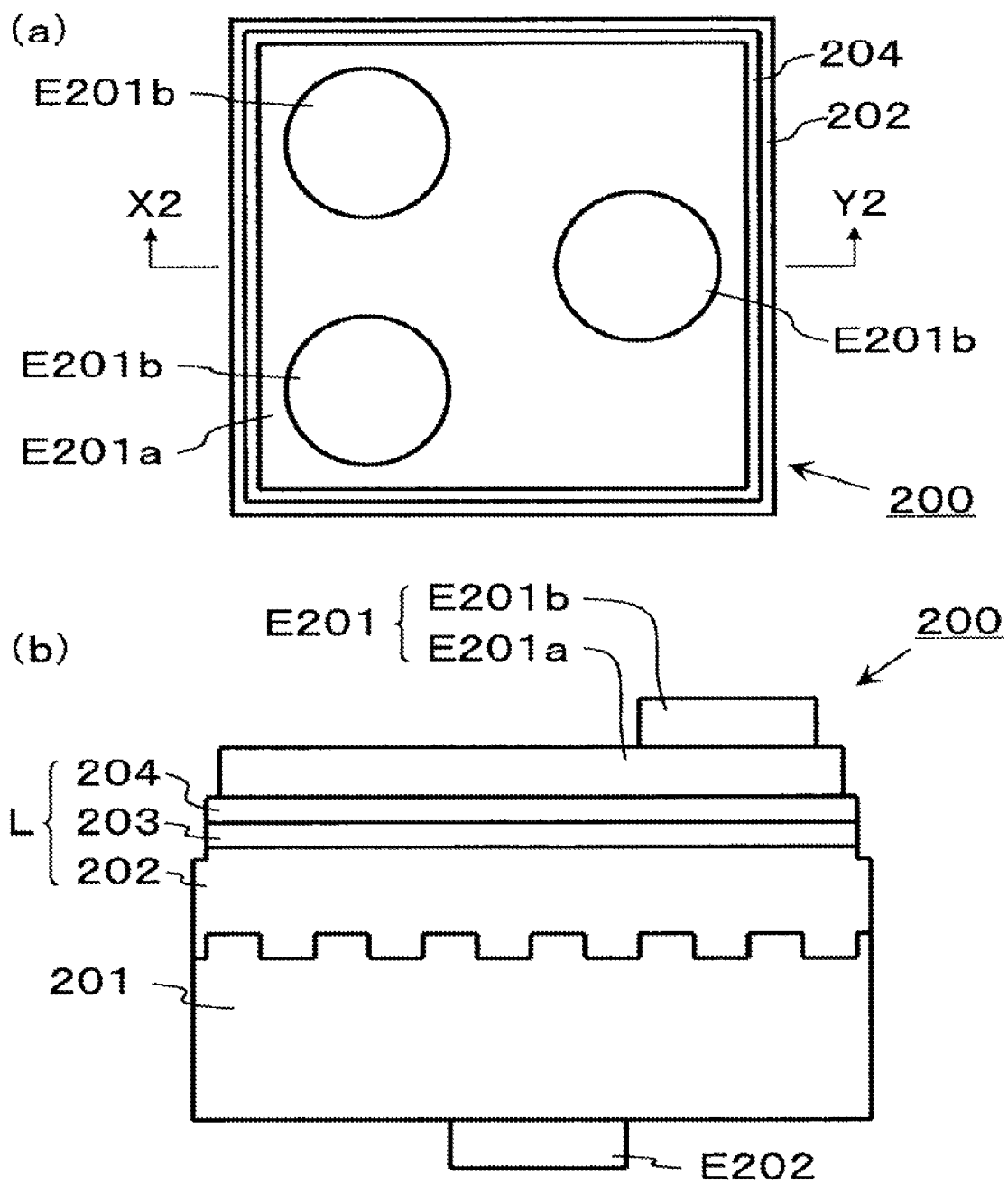

FIG. 4 shows a structure of the GaN-based LED chip 200 contained in the light emitting device 2, wherein FIG. 4(a) is a top view and FIG. 4(b) is a sectional view along the line X2-Y2 in FIG. 4(a). The GaN-based LED chip 100 in the aforementioned embodiment 1 has a horizontal-type element structure, whereas the GaN-based LED chip 200 has a vertical-type element structure. Except the part relating to the difference in element structures, preferable embodiment of each part of the GaN-based LED chip 200 is the same as that in GaN-based LED chip 100.

In the GaN-based LED chip 200, to realize a vertical-type element structure, a conductive substrate is used as a light-transmissive substrate 201. Preferably, an n-type conductive semiconductor single crystal substrate made of silicon carbonate, zinc oxide, GaN, AlGaN and the like is used. A GaN-based semiconductor layer L is formed on the light-transmissive substrate 201, and the GaN-based semiconductor layer L has a laminate structure comprising an n-type layer 202, a light emitting layer 203 and a p-type layer 204 in this order from the light-transmissive substrate 201 side. The n-type layer 202 is directly or via a thin buffer layer (not shown) formed on the light-transmissive substrate 201 to be electrically connected to the light-transmissive substrate 201. The buffer layer may be made conductive by doping.

A negative electrode E202 is formed on the backside of light-transmissive substrate 201. In this embodiment, non-limitatively, the negative electrode E202 acts as both an ohmic electrode and a contact electrode, though the negative electrode may consist of a light-transmissive ohmic electrode and a metallic contact electrode partially formed on the surface thereof.

A positive electrode E201 is formed on the p-type layer 204. The positive electrode E201 consists of a light-transmissive electrode E201a made from an oxide semiconductor and a positive contact electrode E201b formed on and electrically connected to the light-transmissive electrode E201a. The positive contact electrode E201b is formed not so as to occupy too large area on the p-type layer 204. To stabilize the flip-chip mounting posture of LED chip, the number of positive contact electrode E201b is set to three and they are positioned to form a triangle. The number may be four or above, but three is most preferable because the area of one positive contact electrode being necessary when considering chip mounting workability and the like is ensured, and at the same time the total area can be made small, as well as the mounting posture of LED chip is most stable due to three-point support.

Other Preferable Embodiments

In the above, as Embodiment 1, an example wherein a GaN-based LED chip having a horizontal-type element structure is applied to an SMD type LED package is shown and, as Embodiment 2, an example wherein a GaN-based LED chip having a vertical-type element structure is applied to a bullet type LED package is shown. However, the combination of element structure of LED chip and package type is not limited to them. That is, a GaN-based LED chip having a horizontal-type element structure may be applied to a bullet type LED package, or a GaN-based LED chip having a vertical-type element structure may be applied to an SMD-type LED package. In the above-mentioned embodiments, moreover, a GaN-based LED chip is directly fixed on a substrate of a SMD-type package or a lead frame. However, the GaN-based LED chip may be fixed on these bases via a submount.

Figure 5:
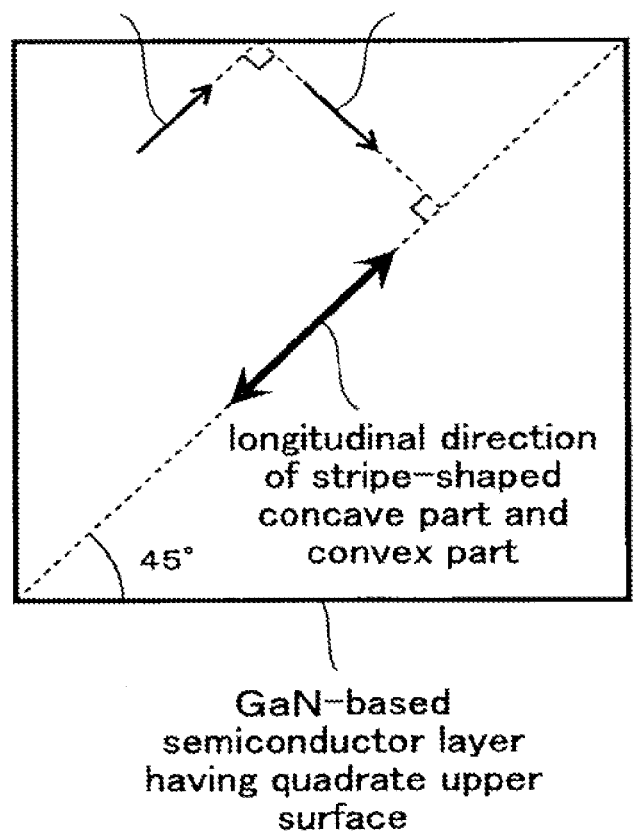
FIG. 5 presents an explanation of a mechanism of reduced light confinement within a GaN-based semiconductor layer for a GaN-based LED chip according to an embodiment of the present invention.

In a GaN-based LED chip usable for the light emitting device of the present invention, when the surface of a light-transmissive substrate is a concave-convex surface, one of a preferable concave-convex pattern is a pattern wherein a stripe-like concave part (groove) and a convex part (ridge) are alternately arranged. When such a concave-convex pattern is employed, anisotropy occurs in the light scattering action at the bended interface formed between a light-transmissive substrate and a GaN-based semiconductor layer. That is, among the components of light propagating in the layer direction (direction perpendicular to film thickness direction of layers) in the GaN-based semiconductor layer, the component propagateing in the direction orthogonal to the longitudinal direction of the stripe-like concave part and convex part of the substrate surface is strongly scattered. On the other hand, the component propagating in the direction parallel to the longitudinal direction is hardly scattered. Therefore, when such a concave-convex pattern is employed for an LED chip wherein the shape of an upper surface of a GaN-based semiconductor layer is quadrate (square or rectangle), the direction of the concave-convex pattern is preferably determined such that the longitudinal direction of the stripe-like concave part and convex part forms an angle of about 45 degrees (40 degrees-50 degrees) with the four sides constituting the quadrate. When the direction of the concave-convex pattern is determined in this manner, the component propagating in the direction parallel to the longitudinal direction of the stripe-like concave part and convex part are reflected on the end surface of the GaN-based semiconductor layer, whereby the propagation direction is changed to that orthogonal to the longitudinal direction (FIG. 5). That is, the propagation direction of the light component propagating in the direction hardly accompanying scattering changes to the direction accompanying strong scattering due to the reflection. As a result, the light confinement within the GaN-based semiconductor layer becomes weakened.

In a GaN-based LED chip usable for the light emitting device of the present invention, at least the surface of the LED chip on the GaN-based semiconductor layer side (including the surface of light-transmissive electrode but excluding the surface of contact electrode) is preferably coated with a light-transmissive insulating protective film, so that a short-circuit due to a conductive bonding agent will not occur in a flip-chip mounting process. To promote light reflection on the interface between a light-transmissive insulating protective film and a light-transmissive encapsulant (gas in the case of airtight seal), the planarity of the surface of the insulating protective film is made as high as possible. Particularly, when the surface of the light-transmissive electrode has fine protrusions and depressions, the light easily passes the interface between the light-transmissive electrode and the insulating protective film and enters the insulating protective film. To prevent the light from going out of the LED chip through the surface of the insulating protective film, the surface of the insulating protective film should have higher planarity than the surface of the light-transmissive electrode. For this end, the insulating protective film is preferably an amorphous film. Specifically, a silicon oxide film and a silicon nitride film formed by plasma CVD method, a PSG (Phospho-Silicate-Glass) film and a BPSG (Boro-Phospho-Silicate-Glass) film formed by CVD method, a polyimide film formed by a coating method and the like can be exemplified. When a silicon oxide film or a silicon nitride film is formed by a plasma CVD method on an ITO film having fine protrusions and depressions on the surface, the surface of the silicon oxide or silicon nitride film has higher planarity than that of the ITO film by setting the film thickness to not less than 0.3 µm. A PSG film and a BPSG film can have still higher surface planarity by reflow after film formation. An insulating protective film formed by spin-on-glass can also have high surface planarity. In one embodiment, the surface planarity of light-transmissive electrode may be increased by polishing. In this case, the surface planarity of the insulating protective film formed on the light-transmissive electrode becomes naturally higher. As a result, light reflection on the interface between the insulating protective film and the light-transmissive encapsulant (gas in case of airtight seal) is also promoted.

When the light-transmissive electrode is formed of ITO, by setting the refractive index of the insulating protective film to the same level as or higher than that of ITO (not less than 1.7), light reflection on the interface between the insulating protective film and the light-transmissive encapsulant (gas in the case of airtight seal) can be promoted. In this case, the refractive index of an insulating protective film is preferably smaller than that of a GaN-based semiconductor (not more than 2.5) to prevent strong light confinement within the insulating protective film. Preferable examples of the material for the insulating protective film having such refractive index include aluminum oxide, spinel, silicon nitride, zirconium oxide, tantalum oxide and niobium oxide. A film of a mixture of plural oxides can also be used. In this embodiment, when the insulating protective film is a polycrystalline film, the surface planarity is preferably improved by a polishing treatment. Specifically, the surface roughness is preferably less than 20 nm, more preferably less than 10 nm, as measured by a stylus-type surface profiler, in all roughness indices of arithmetic mean roughness (Ra), maximum height (Rmax), ten points average height (Rz) and the like.

In an embodiment where the surface planarity of the light-transmissive electrode is improved by forming the light-transmissive electrode from amorphous conductive oxide, surface polishing and the like, the insulating protective film may be formed from a material having a low refractive index so that reflection on the interface between the light-transmissive electrode and the insulating protective film can be promoted. In this case, examples of a particularly preferable material for the insulating protective film include low refractive index materials having a refractive index of 1.4 or below such as metal fluorides (e.g., magnesium fluoride, lithium fluoride and the like) and fluororesin.

Figure 6:
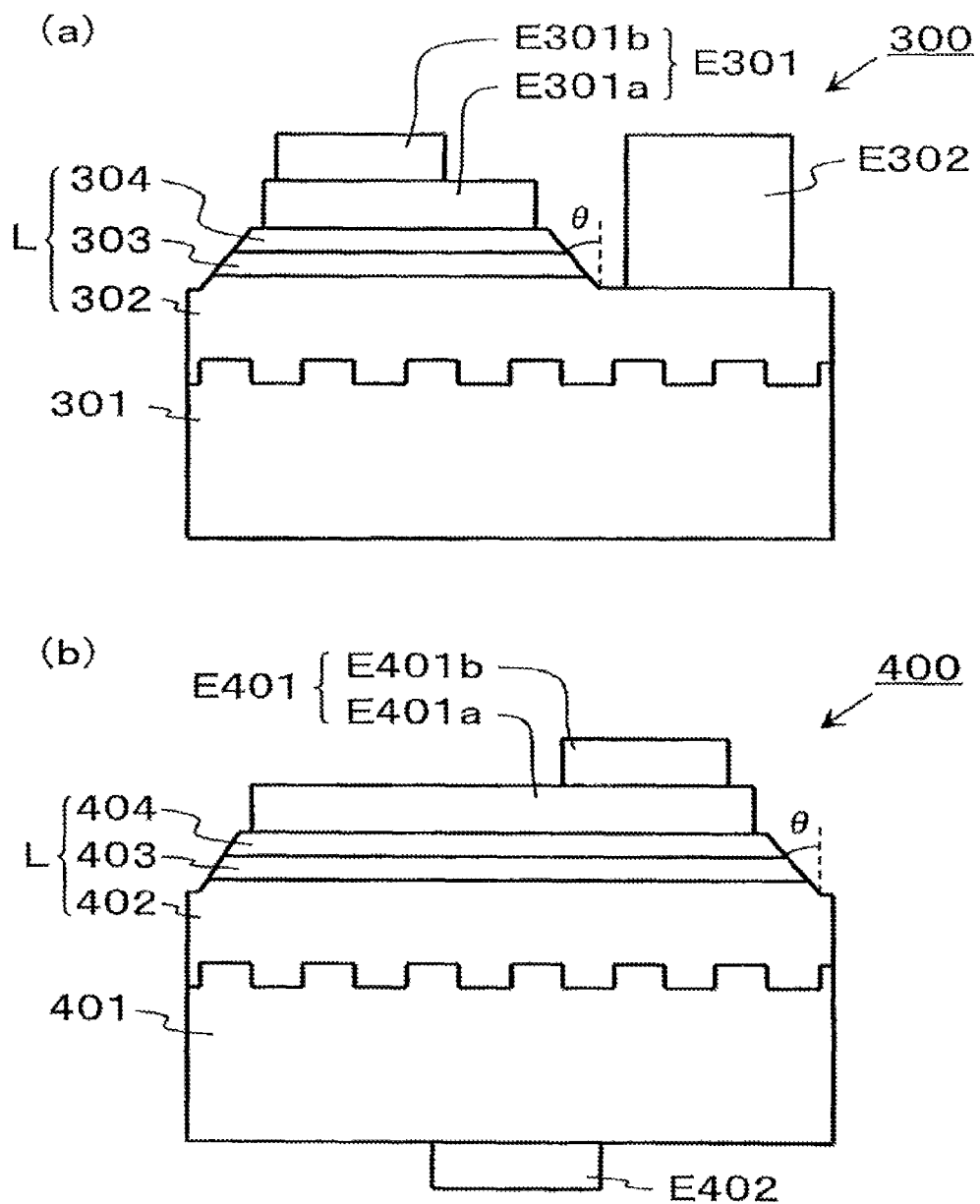

In GaN-based LED chips, a double heterostructure wherein an InGaN light emitting layer is sandwiched between clad layers composed of GaN or AlGaN is often employed. In such a case, the light tends to be strongly confined in an InGaN light emitting layer having a high refractive index. Thus, a GaN-based LED chip usable for the light emitting device of the present invention preferably has a slope in a part of an end surface of a GaN-based semiconductor layer, so that the cross-sectional area decreases with the distance from the light-transmissive substrate, wherein the cross-sectional area being an area obtainable by cutting a part of the GaN-based semiconductor layer including the light emitting layer and the p-type layer formed thereon with a plane perpendicular to the thickness direction. In this way, the light propagating in the layer direction in the InGaN light emitting layer can be reflected on the sloping end surface of the GaN-based semiconductor layer to advance toward the light-transmissive substrate side. FIG. 6 is a sectional view of a GaN-based LED chip constituted in this manner. The GaN-based LED chip 300 shown in FIG. 6(*a*) has a horizontal-type element structure and the GaN-based LED chip 400 shown in FIG. 6(*b*) has a vertical-type element structure. In both chips, the part from light emitting layers 303, 403 to p-type layers 304, 404 in the GaN-based semiconductor layers L has a cross-sectional area obtainable by cutting it with a plane orthogonal to the thickness direction, which decreases with the distance from the light-transmissive substrates 301, 401. The sloping end surface of GaN-based semiconductor layer L and a line parallel to the film thickness direction of the GaN-based semiconductor layer L preferably form an angle θ of 20 degrees-60 degrees, more preferably 30 degrees-50 degrees, particularly preferably 40 degrees-45 degrees.

Figure 7:
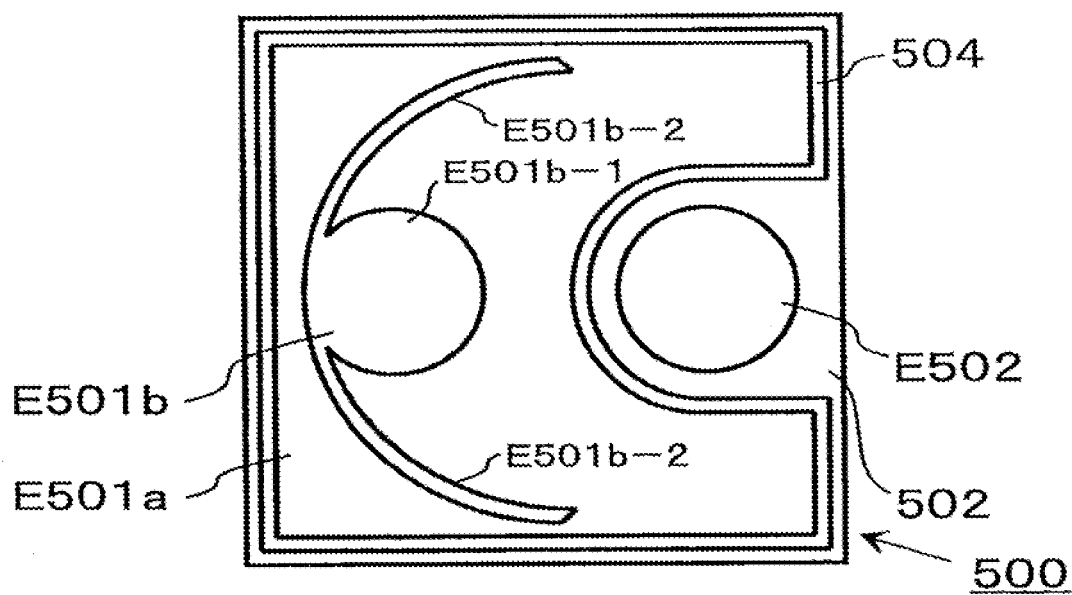
FIG. 7 is a top view of a GaN-based LED chip usable in a light emitting device according to an embodiment of the present invention.

A GaN-based LED chip usable for the light emitting device of the present invention has a positive contact electrode optionally constituted of a major part mainly used for bonding to a base in a mounting process, and a long-shape current diffusion part extending from the major part on the light-transmissive electrode. A top view of a GaN-based LED chip having a positive contact electrode constituted in this manner is shown in FIG. 7. In a GaN-based LED chip 500 shown in this Figure, the positive contact electrode E501*b* is constituted of a circular major part E501*b*-1, and two current diffusion parts E501*b*-2 extending in an elongated manner therefrom in a curve. The current diffusion part helps current diffusion in the layer direction in the light-transmissive electrode made of an oxide semiconductor. Moreover, since the thermal conductivity of the entire positive electrode becomes higher and heat dissipation performance of the LED chip is improved, an increase in current tolerance value of the LED chip is expected to result.

Figure 8:
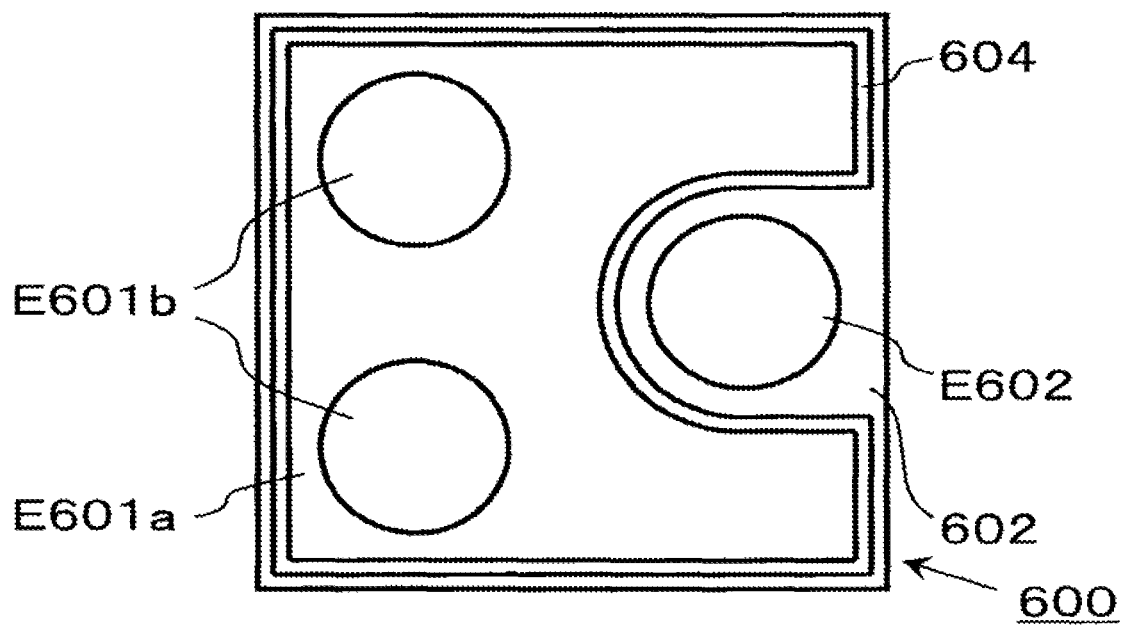
FIG. 8 is a top view of a GaN-based LED chip usable in a light emitting device according to an embodiment of the present invention.

When a GaN-based LED chip usable for the light emitting device of the present invention has a horizontal-type element structure, two or more positive contact electrodes may be formed on a p-type layer. FIG. 8 is a top view of a GaN-based LED chip having a horizontal-type element structure, wherein the number of the negative contact electrode (the negative electrode acting as both a contact electrode and an ohmic electrode) is one, and the number of the positive contact electrode is two. In a flip-chip mounting process the GaN-based LED chip 600 shown in this Figure is bonded to a base by three contact electrodes including one negative electrode E602 and two positive contact electrodes E601*b*. Since the three contact electrodes are positioned to form a triangle, the stability of mounting posture becomes extremely high. The number of the positive contact electrodes here means the number of the major parts mainly used for bonding to a base. In the example of GaN-based LED 600, two positive contact electrodes E601*b* can be connected with a long-shape current diffusion part. Also in this case, the number of the positive contact electrodes is two. To stabilize the mounting posture of an LED chip, two negative contact electrodes and one positive contact electrode may be positioned to form a triangle.

In the present invention, it is not essential to leave, in a GaN-based LED chip equipped in the light emitting device, a substrate used for epitaxial growth ("growth substrate") of GaN-based semiconductor crystal constituting the light emitting element structure. In other words, in one embodiment, a GaN-based LED chip mounted on a light emitting device may have a light-transmissive supporting substrate, which substrate has been substituted with a growth substrate after formation of the GaN-based semiconductor layer. In another embodiment, a GaN-based LED chip equipped in the light emitting device may be produced by a production method including the following two steps, i.e., a step of joining, by a wafer bonding technique, a light-transmissive supporting substrate to the surface of a GaN-based semiconductor layer formed on a growth substrate, and a step of separating the growth substrate from the GaN-based semiconductor layer by a laser lift-off technique.

According to an embodiment of the present invention, a GaN-based LED chip equipped in the light emitting device may be free of a substrate joined to a GaN-based semiconductor layer. Such light emitting device can be produced by, for example, flip-chip mounting the GaN-based LED chip shown in FIG. 2, and then separating the light-transmissive substrate from the GaN-based semiconductor layer by a laser lift-off technique.

Furthermore, the scope of the present invention encompasses not only a light emitting device comprising a flip-chip mounted GaN-based LED chip comprising a light-transmissive substrate and having a vertical-type element structure, but also a light emitting device comprising the same LED chip fixed with the surface on the light-transmissive substrate side facing a mounting base direction (direction opposite light extraction direction). That is, in such a light emitting device, the light emission power can be improved by preventing the area of the contact electrode (total sum of plural electrode areas when forming plural electrodes) formed on the backside of a light-transmissive substrate directly or via a light-transmissive ohmic electrode from being too large.

The ratio of the area of the contact electrode to the area of the backside of the light-transmissive substrate is preferably less than ½, more preferably less than ¼, still more preferably less than ¹⁄₁₀. The area of the contact electrode is desiably not less than 3% of the area of the backside of light-transmissive substrate, thereby ensuring bonding strength between the LED chip and a base, and allowing the heat generated in the LED chip to escape to the base side through the contact electrode.

Also in this light emitting device, the backside of light-transmissive substrate is preferably polished to have high planarity before formation of a contact electrode. When a light-transmissive ohmic electrode composed of an oxide semiconductor is interposed between the backside of light-transmissive substrate and the contact electrode, the surface of the oxide semiconductor is preferably polished to have high planarity, before forming the contact electrode. When the backside of a light-transmissive substrate and the surface of a light-transmissive ohmic electrode are planarized by polishing, the roughness of the surface after polishing is preferably less than 20 nm, more preferably less than 10 nm, as measured by a stylus-type surface profiler, in all roughness indices of arithmetic mean roughness (Ra), maximum height (Rmax), ten points average height (Rz) and the like.

EXAMPLES

The experiments performed by the present inventors are described in the following.

Experimental Example 1

Production of GaN-Based LED Chip

As a substrate for crystal growth, a c-plane sapphire substrate (diameter 2 inch) processed to have a stripe-like concave-convex pattern (groove width and ridge width: about 3 μm, groove depth: about 1 μm) on the surface was prepared. Using a usual MOVPE apparatus, an LED wafer was produced by successively laminating, on the surface with the above-mentioned concave-convex pattern of the sapphire substrate, an AlGaN low-temperature buffer layer, a non-doped GaN layer, a Si-doped GaN contact layer, an InGaN/GaN multiple quantum well active layer (light emitting layer), a Mg-doped AlGaN clad layer and a Mg-doped AlGaN contact layer. Here, the crystal composition of the InGaN quantum well layer contained in the active layer was adjusted to have an emission wavelength of about 405 nm. Mg added as p-type impurity to the AlGaN clad layer and AlGaN contact layer was activated after formation of the AlGaN contact layer by first introducing a small amount of ammonia and a nitrogen gas into the growth furnace of MOCVD apparatus and changing the gas to a nitrogen gas alone on the way in the process of lowering the temperature of the substrate placed in the furnace from the growth temperature of the layer to room temperature.

Using an electron beam evaporation method, a light-transmissive electrode made of ITO (indium tin oxide) and having a film thickness of about 210 nm and sheet resistance of about 10Ω/☐ was formed on the surface of the thus-obtained LED wafer (upper surface of AlGaN contact layer). After patterning the light-transmissive electrode into a predetermined shape, the p-type layer (AlGaN contact layer and AlGaN clad layer) and active layer were partially removed by reactive ion etching (RIE) to expose a part of the GaN contact layer. In the RIE step, the p-type layer and light emitting layer were removed to expose the GaN contact layer also in a region between elements adjacent to each other on the wafer, whereby the area of the upper surface of AlGaN contact layer of each element was set to a given value (65300 μm$^2$). The upper surface of the AlGaN contact layer after the RIE step was almost entirely covered with the light-transmissive electrode.

Then, formation of a negative electrode onto the surface of the GaN contact layer exposed in the above-mentioned RIE step and formation of a positive contact electrode onto the surface of the light-transmissive electrode were simultaneously performed using a sputtering method. The negative electrode and positive contact electrode were formed into a two-layer structure by forming a TiW layer having a film thickness of 100 nm, and laminating an Au layer having a film thickness of 500 nm thereon. The TiW layer was formed using a Ti—W target with a Ti content of 10 wt %. The negative electrode and positive contact electrode were patterned by a lift-off method using a photolithography technique. The photo-mask used for the patterning was provided with seven patterns of positive contact electrode having different areas, whereby seven kinds of LED elements having different areas of the positive contact electrode were produced on one piece of wafer.

Lastly, the elements formed on the wafer were cut by an ordinary scribing method into square-shape GaN-based LED chips with a side length of about 350 μm.

The area of the positive contact electrode (A1), and the ratios of said area of the positive contact electrode to the area of the upper surface of the p-type layer (A2: 65300 μm$^2$), for the seven kinds of GaN-based LED chip samples (sample 1 to sample 7) with different positive contact electrode areas produced according to the above-mentioned steps are shown in Table 1.

TABLE 1

| | area of positive contact electrode (A1) [μm$^2$] | area of upper surface of p-type layer (A2) [μm$^2$] | A1/A2 [%] | output power [mW] |
|---|---|---|---|---|
| sample 1 | 6360 | 65300 | 10 | 16.5 |
| sample 2 | 9900 | 65300 | 15 | 16.4 |
| sample 3 | 13050 | 65300 | 20 | 16.0 |
| sample 4 | 16200 | 65300 | 25 | 16.0 |
| sample 5 | 19800 | 65300 | 30 | 15.3 |
| sample 6 | 23100 | 65300 | 35 | 15.4 |
| sample 7 | 29700 | 65300 | 45 | 15.1 |

Preparation of Submount

A submount shown in FIG. 9 was prepared. FIG. 9(a) is a plane view of the submount seen from the LED chip mounting face side, and FIG. 9(b) is a sectional view along the line P-Q in FIG. 9(a). The submount has an AlN substrate (thickness 0.2 mm, width 0.4 mm and length 0.6 mm), a positive side lead electrode, and a negative side lead electrode. Both the positive side lead electrode and negative side lead electrode have a multi-layer structure having a Ti layer, a Pt layer and a Au layer in this order from the side in contact with the AlN substrate toward the surface side. A solder layer composed of an Au—Sn alloy solder containing Au at a ratio of 70 wt % is partially formed on the positive side lead electrode and negative side lead electrode.

The submount was adhered to TO-18 stem with a silver paste with the LED chip mounting face upward.

Flip-Chip Mounting

Figure 10:
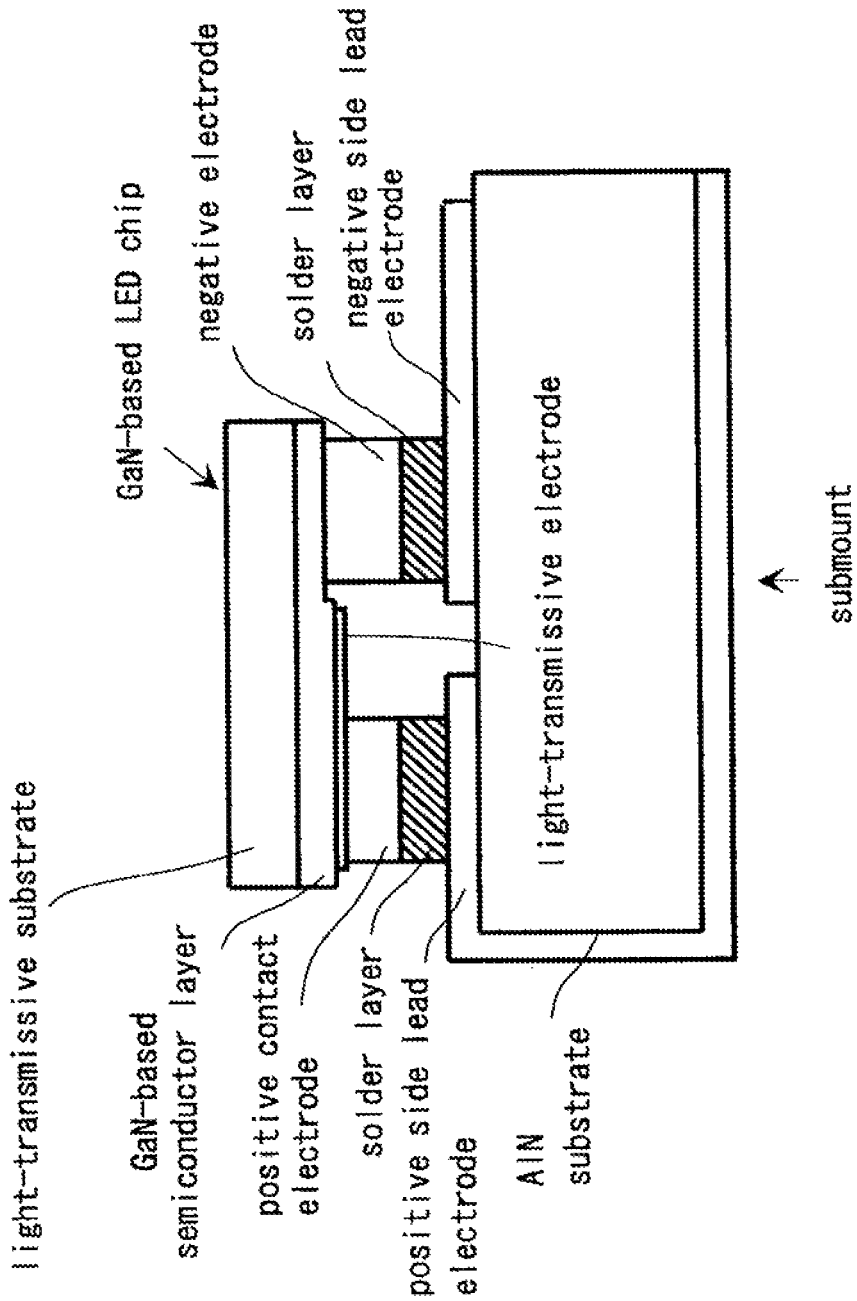
FIG. 10 is a sectional view of the submount and the GaN-based LED chip mounted thereon in Experimental Example 1 after completion of the mounting.

The GaN-based LED chip produced above was mounted on the above-mentioned submount adhered onto the TO-18 stem with the sapphire substrate side facing upward. To be specific, flux was applied in advance to the LED chip mounting face of the submount, and the GaN-based LED chip was placed thereon. The TO-18 stem was contacted with a heated heater to indirectly heat the submount to evaporate a part of the flux and melt the solder layer, whereby the contact electrode of the LED chip side and the lead electrode of the submount side were connected. In other words, the positive contact electrode of the LED chip and the positive side lead electrode of the submount, and the negative electrode of the LED chip and the negative side lead electrode of the submount were respectively bonded together with Au—Sn alloy solder. Thereafter, the negative side lead electrode of the submount and one electrode of the TO-18 stem were connected with a bonding wire, and the residual flux was removed by washing to complete the mounting. FIG. 10 shows a cross-section of the submount and the GaN-based LED chip mounted thereon after completion of the mounting. As shown in the Figure, a gap was formed between the surface of the GaN-based LED chip on the GaN-based semiconductor layer side and the submount, except the parts joined via the solder layer.

Measurement of Output Power

Figure 11:
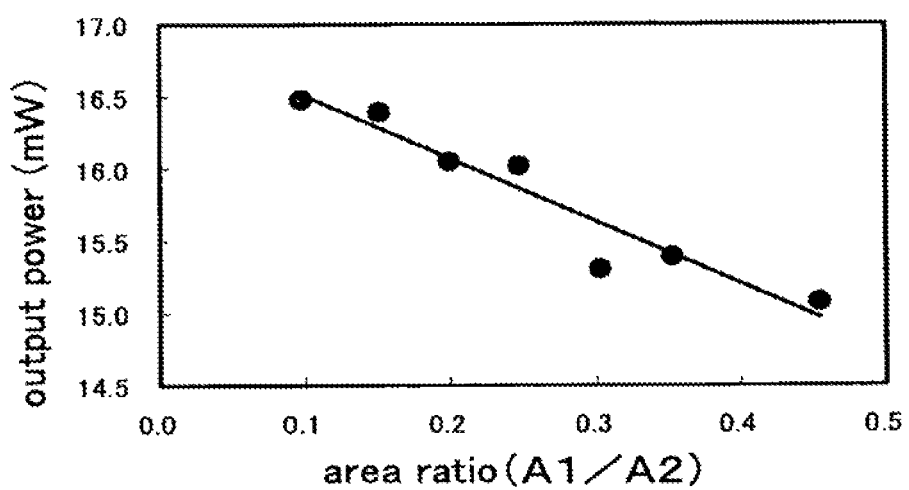
FIG. 11 shows the relationship between the ratio of the area of positive contact electrode to the area of upper surface of p-type layer and the output power for the GaN-based LED chip samples obtained in Experimental Example 1.

The emission power at 20 mA forward current of the GaN-based LED chip mounted by the above-mentioned procedure was measured using an integrating sphere. The results are shown in Table 1. In addition, FIG. 11 shows the relationship between the ratio (A1/A2) of the area of the positive contact electrode (A1) to the area of the upper surface of the p-type layer (A2), and the output power, for the GaN-based LED chip samples obtained in Experimental Example 1. It is understood from the Figure that a sample having a smaller area of the positive contact electrode tended to show a higher output power.

Comparative Experimental Example

In the same manner as in the above-mentioned samples 1 to 7 except that the positive electrode was a metal film in contact with the AlGaN contact layer at a Rh layer having a film thickness of 50 nm (a laminate of a Rh film and a Au/Pt alternately laminated film stacked thereon), a GaN-based LED chip sample for comparison was produced. In the comparative sample, the area of the upper surface of the AlGaN contact layer was the same as that of the above-mentioned samples 1 to 7, and the area of the positive electrode (area of the Rh reflection layer) was the same as that of the light-transmissive electrode in the above-mentioned samples 1 to 7. In the same manner as in the above-mentioned samples 1 to 7, the comparative sample was flip-chip mounted and the output power at 20 mA was measured to obtain 12 mW.

Experimental Example 2

Figure 12:
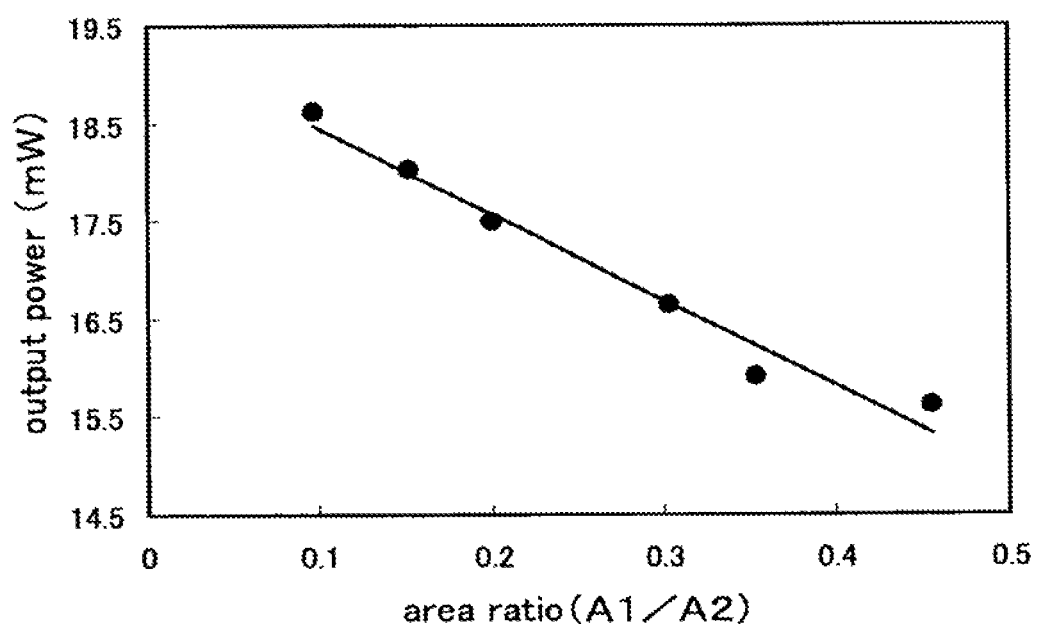
FIG. 12 shows the relationship between the ratio of the area of positive contact electrode to the area of upper surface of p-type layer and the output power for the GaN-based LED chip samples obtained in Experimental Example 2.

In the Experimental Example 2, a submount having a white alumina substrate and a lead electrode with an Au layer as a surface layer formed on the substrate surface was used. A GaN-based LED chip sample was produced in the same manner as in Experimental Example 1. The GaN-based LED chip was flip-chip mounted on the submount by bonding a contact electrode on the LED chip side and a lead electrode on the submount side with a silver paste. A gap was formed between the surface of the mounted LED chip on the GaN-based semiconductor layer side (excluding the surface of the positive and negative contact electrode) and the submount. The emission power at 20 mA forward current of the thus-mounted GaN-based LED chip was measured using an integrating sphere. FIG. 12 shows the relationship between the ratio (A1/A2) of the area of the positive contact electrode (A1) to the area of the upper surface of the p-type layer (A2), and the output power, for the GaN-based LED chip samples obtained in Experimental Example 2.

Experimental Example 3

Figure 13:
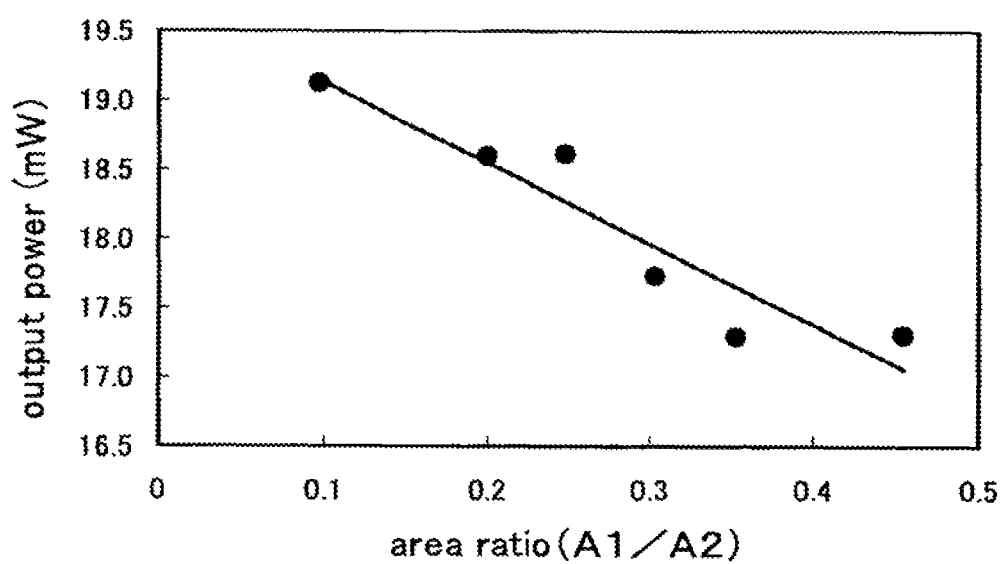
FIG. 13 shows the relationship between the ratio of the area of positive contact electrode to the area of upper surface of p-type layer and the output power for the GaN-based LED chip samples obtained in Experimental Example 3.

In Experimental Example 3, the surface of a GaN-based LED chip flip-chip mounted on a submount was coated with an optical-grade silicone resin (thermosetting type). A GaN-based LED chip sample was produced in the same manner as in Experimental Example 1. The submount used was the same as that used in the above-mentioned Experimental Example 2, and the LED chip and the submount were bonded in the same manner as in the above-mentioned Experimental Example 2. After fixing the GaN-based LED chip on the submount, a resin before curing was dropped with a syringe on the LED chip, whereby the surface of the LED chip was coated with the resin. At this time, it was observed that a part of the resin spontaneously entered into the gap between the LED chip and the submount. As the result, the gap was filled with the transparent silicone resin. After curing the silicone resin, the emission power at 20 mA forward current of the GaN-based LED chip was measured using an integrating sphere. FIG. 13 shows the relationship between the ratio (A1/A2) of the area of the positive contact electrode (A1) to the area of the upper surface of the p-type layer (A2), and the output power, for the GaN-based LED chip samples obtained in Experimental Example 3.

The present invention is not limited to the embodiments explicitly described in the above, and can be modified variously without impairing the gist of the invention. Such further embodiments of the light emitting device and the embodiments of the GaN-based LED chip usable therefor are shown in the following as examples.

Embodiment S1

A light emitting device wherein a GaN-based LED chip of the following (a1) is flip-chip mounted:

(a1) a GaN-based LED chip comprising a light-transmissive substrate and a GaN-based semiconductor layer formed on the light-transmissive substrate, the GaN-based semiconductor layer having a laminate structure comprising an n-type layer, a light emitting layer and an p-type layer in this order from the light-transmissive substrate side, wherein a positive electrode is formed on the p-type layer, said electrode comprising
a light-transmissive electrode composed of an oxide semiconductor and having a surface planarized by polishing, and
a positive contact electrode electrically connected to the light-transmissive electrode, and
the area of the positive contact electrode is less than half of the area of the upper surface of the p-type layer.

Embodiment S2

A light emitting device comprising a flip-chip mounted GaN-based LED chip which comprises a light-transmissive substrate, a GaN-based semiconductor layer formed on the light-transmissive substrate, the layer having a laminate structure comprising an n-type layer, a light emitting layer and a p-type layer in this order from the light-transmissive substrate side, and a positive electrode formed on the p-type layer, wherein the positive electrode comprises a light-transmissive electrode composed of an oxide semiconductor and having a surface planarized by polishing, and a positive contact electrode electrically connected to the light-transmissive electrode and having an area smaller than that of the light-transmissive electrode.

Embodiment S3

A light emitting device comprising a GaN-based LED chip and a package having a cavity, wherein
the GaN-based LED chip comprises a GaN-based semiconductor layer having a laminate structure comprising at least an n-type layer and a p-type layer, and an electrode formed on one surface of the GaN-based semiconductor layer, the electrode comprising a light-transmissive electrode composed of an oxide semiconductor and having a surface planarized by polishing, and a contact electrode electrically connected to the light-transmissive electrode and having an area smaller than that of the light-transmissive electrode, and
the GaN-based LED chip is fixed in the cavity with a surface of the chip opposite said surface on which the electrode is formed facing an opening of the cavity.

Embodiment S4

The light emitting device of Embodiment S3, comprising a light-transmissive substrate joined to a surface of the GaN-based semiconductor layer opposite said surface on which the electrode is formed.

Embodiment S5

A GaN-based LED chip comprising a light-transmissive substrate and a GaN-based semiconductor layer formed on the light-transmissive substrate, the GaN-based semiconductor layer having a laminate structure comprising an n-type layer, a light emitting layer and a p-type layer in this order from the light-transmissive substrate side,
wherein a positive electrode is formed on the p-type layer, the electrode comprising a light-transmissive electrode composed of an oxide semiconductor and having a surface planarized by polishing and a positive contact electrode electrically connected to the light-transmissive electrode and having an area smaller than that of the light-transmissive electrode.

Embodiment S6

The GaN-based LED chip of Embodiment S5, wherein the area of the positive contact electrode is less than ½ of the area of the upper surface of the p-type layer.

Embodiment S7

A GaN-based LED chip comprising
a GaN-based semiconductor layer having a laminate structure comprising at least an n-type layer and a p-type layer, and
an electrode formed on one surface of the GaN-based semiconductor layers, the electrode comprising a light-transmissive electrode composed of an oxide semiconductor having a surface planarized by polishing and a contact electrode electrically connected to the light-transmissive electrode and having an area smaller than that of the light-transmissive electrode.

Embodiment S8

The GaN-based LED chip of Embodiment S7, comprising a light-transmissive substrate joined to a surface of the GaN-based semiconductor layer opposite said surface on which the electrode is formed.

Embodiment S9

A light emitting device wherein a GaN-based LED chip having a vertical-type element structure of the following (a2) is flip-chip mounted:
(a2) a GaN-based LED chip comprising a light-transmissive substrate and a GaN-based semiconductor layer formed on the light-transmissive substrate, the GaN-based semiconductor layer having a laminate structure comprising an n-type layer, a light emitting layer and a p-type layer in this order from the light-transmissive substrate side,
wherein a positive electrode is formed on the p-type layer, said electrode comprising
a light-transmissive electrode composed of an oxide semiconductor, and
a positive contact electrode electrically connected to the light-transmissive electrode, and
the area of the positive contact electrode is less than half of the area of the upper surface of the p-type layer.

Embodiment S10

A light emitting device comprising a flip-chip mounted GaN-based LED chip which comprises a conductive light-transmissive substrate, a GaN-based semiconductor layer formed on the light-transmissive substrate, and an electrode formed on the GaN-based semiconductor layer, the GaN-based semiconductor layer having a laminate structure comprising at least an n-type layer and a p-type layer,
wherein the GaN-based LED chip has a vertical-type element structure and the electrode comprises a light-transmissive electrode composed of an oxide semiconductor and a positive contact electrode electrically connected to the light-transmissive electrode and having an area smaller than that of the light-transmissive electrode.

Embodiment S11

A light emitting device comprising a package having a cavity and a GaN-based LED chip fixed inside the cavity, the GaN-based LED chip comprising a conductive light-transmissive substrate, a GaN-based semiconductor layer formed on said light-transmissive substrate, the layer having a laminate structure comprising at least an n-type layer and a p-type layer, and an electrode formed on the backside of said light-transmissive substrate, wherein
the electrode has a contact electrode formed on the backside of said light-transmissive substrate directly or via a light-transmissive ohmic electrode,
the area of said contact electrode is less than ½ of the area of the backside of said light-transmissive substrate, and
the GaN-based LED chip is fixed with a surface on the GaN-based semiconductor layer side facing an opening of the cavity.

Embodiment S12

A GaN-based LED chip comprising a conductive light-transmissive substrate, a GaN-based semiconductor layer having a laminate structure comprising at least an n-type layer and a p-type layer and formed on the light-transmissive substrate, and a contact electrode composed of an oxide semiconductor and formed on the backside of the light-transmissive substrate via a light-transmissive ohmic electrode, wherein the surface of the ohmic electrode is planarized by polishing.

Embodiment S13

The GaN-based LED chip of Embodiment S12, wherein the contact electrode has an area smaller than that of the ohmic electrode.

Embodiment S14

The GaN-based LED chip of Embodiment S12 or S13, wherein the area of the contact electrode is less than ½ of the area of the backside of the light-transmissive substrate.

Embodiment S15

A light emitting device comprising the GaN-based LED chip of any of Embodiments S12 to S14 and a package having a cavity, wherein the GaN-based LED chip is fixed in the cavity with a surface of the chip on the GaN-based semiconductor layer side facing an opening of the cavity.

Embodiment S16

A method of producing a GaN-based LED chip comprising a conductive light-transmissive substrate, a GaN-based semiconductor layer having a laminate structure comprising at least an n-type layer and a p-type layer and formed on the light-transmissive substrate, and a contact electrode formed on the backside of the light-transmissive substrate via a light-transmissive ohmic electrode composed of an oxide semiconductor,
wherein after the surface of the ohmic electrode is planarized by polishing, the contact electrode is formed on said surface.

Embodiment S17

The production method of Embodiment S16, wherein the contact electrode has an area smaller than that of the ohmic electrode.

Embodiment S18

The production method of Embodiment S16 or S17, wherein the area of the contact electrode is less than ½ of the area of the backside of the light-transmissive substrate.

Embodiment S19

A light emitting device, comprising the GaN-based LED chip in the above-mentioned (a) which is flip-chip mounted and encapsulated with a resin.

Embodiment S20

A light emitting device, comprising the GaN-based LED chip in the above-mentioned (a) which is flip-chip mounted and airtightly sealed.

Embodiment S21

The light emitting device of Embodiment S19 or S20, wherein the light-transmissive electrode has a surface planarized by polishing.

Embodiment S22

The light emitting device of any of Embodiments S19 to S21, wherein the GaN-based LED chip has a negative contact electrode electrically connected to the n-type layer and the positive contact electrode on the same side of the LED chip, the number of contact electrodes including the negative contact electrode and the positive contact electrode is three, and the three contact electrodes are positioned to form a triangle.

Embodiment S23

The light emitting device of any of Embodiments S19 to S21, wherein the GaN-based LED chip has a vertical-type element structure, the number of the positive contact electrodes is three and the three positive contact electrodes are positioned to form a triangle.

According to the present invention, a light emitting device comprising a flip-chip mounted GaN-based LED chip is improved in output power, whereby a light emitting device being superior in output power and usable preferably as an excitation light source of a white light emitting device for illumination use is provided.

This application is based on patent application Nos. 2006-274510, 2007-242170, 2007-242171, 2007-242172 and 2007-246410 filed in Japan, the contents of which are incorporated in full herein by this reference.

The invention claimed is:

1. A light emitting device comprising:
a GaN-based LED chip, said GaN-based LED chip being flip-chip mounted, and comprising a light-transmissive substrate, a GaN-based semiconductor layer disposed on said light-transmissive substrate, and a negative electrode partially disposed on a backside of said light-transmissive substrate, said light-transmissive substrate having electrical conductivity, and said GaN-based semiconductor layer having a laminate structure comprising an n-type layer, a light emitting layer and a p-type layer in this order from a light-transmissive substrate side,
wherein a positive electrode is disposed on the p-type layer, said electrode comprising
a light-transmissive electrode including an oxide semiconductor, and
a positive contact electrode electrically connected to said light-transmissive electrode, and
wherein an area of said positive contact electrode is smaller than an area of said light-transmissive electrode.

2. The light emitting device of claim 1, wherein said positive contact electrode is one of three positive contact electrodes and said three positive contact electrodes are positioned to form a triangle.

3. The light emitting device of claim 1, wherein said GaN-based LED chip is encapsulated with a resin.

4. The light emitting device of claim 1, wherein said light-transmissive electrode has a planarized surface, said planarized surface being planarized by polishing.

5. The light emitting device of claim 1, wherein said light-transmissive substrate is an n-type conductive semiconductor single crystal substrate.

6. The light emitting device of claim 5, wherein said light-transmissive substrate is a silicon carbide, zinc oxide, GaN or AlGaN.

7. The light emitting device of claim 1, wherein said positive contact electrode is a single layer film or multi-layer film having, at least on a side in contact with said light-transmissive electrode, a layer made of Al, Ag, Rh or Pt or an alloy made from at least one of Al, Ag, Rh and Pt.

8. The light emitting device of claim 1, further comprising an insulating protective film applied so as to coat a surface of said light-transmissive electrode, said film having a surface with higher planarity than a planarity of said surface of said light-transmissive electrode.

9. The light emitting device of claim 1, wherein said positive contact electrode includes
 a part bonded to a base, and
 a current diffusion part extending from said part on said light-transmissive electrode.

10. The light emitting device of claim 1, wherein the negative electrode includes
 a light-transmissive ohmic electrode, and
 a metallic contact electrode partially disposed on a surface of said light-transmissive ohmic electrode.

11. The light emitting device of claim 1, wherein said negative electrode is a metal electrode, which acts as both an ohmic electrode and a contact electrode.

* * * * *